(12) United States Patent
de Boer et al.

(10) Patent No.: US 9,678,443 B2
(45) Date of Patent: Jun. 13, 2017

(54) LITHOGRAPHY SYSTEM WITH DIFFERENTIAL INTERFEROMETER MODULE

(75) Inventors: Guido de Boer, Leerdam (NL); Thomas Adriaan Ooms, Delfgauw (NL); Niels Vergeer, Rotterdam (NL); Godefridus Cornelius Antonius Couweleers, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 914 days.

(21) Appl. No.: 13/436,736

(22) Filed: Mar. 30, 2012

(65) Prior Publication Data

US 2012/0249984 A1    Oct. 4, 2012

(30) Foreign Application Priority Data

Mar. 30, 2011    (NL) ...................................... 2006496

(51) Int. Cl.
G03B 27/42 (2006.01)
G03F 7/20 (2006.01)
G01B 9/02 (2006.01)

(52) U.S. Cl.
CPC ..... *G03F 7/70775* (2013.01); *G01B 9/02007* (2013.01); *G01B 9/02015* (2013.01); *G03F 7/7085* (2013.01); *G03F 7/70833* (2013.01); *H01J 2237/30438* (2013.01)

(58) Field of Classification Search
CPC . G03F 7/70775; G03F 7/70833; G03F 7/7085
See application file for complete search history.

(56) References Cited

U.S. PATENT DOCUMENTS

| 4,504,147 A | 3/1985 | Huang |
| 4,891,526 A | 1/1990 | Reeds |
| 5,719,702 A | 2/1998 | Decker |

(Continued)

FOREIGN PATENT DOCUMENTS

| CN | 1703609 A | 11/2005 |
| CN | 1916561 | 2/2007 |

(Continued)

OTHER PUBLICATIONS

Chapman, M., "Heterodyne and homodyne interferometry", Renishaw 2002.

(Continued)

*Primary Examiner* — Deoram Persaud
(74) *Attorney, Agent, or Firm* — Blakely Sokoloff Taylor & Zafman LLP

(57) ABSTRACT

The invention relates to a lithography system comprising an optical column, a moveable target carrier for displacing a target such as a wafer, and a differential interferometer module, wherein the interferometer module is adapted for emitting three reference beams towards a first mirror and three measurement beams towards a second mirror for determining a displacement between said first and second mirror. In a preferred embodiment the same module is adapted for measuring a relative rotation around two perpendicular axes as well. The present invention further relates to an interferometer module and method for measuring such a displacement and rotations.

42 Claims, 10 Drawing Sheets

(56) References Cited

U.S. PATENT DOCUMENTS

| | | | |
|---|---|---|---|
| 5,745,242 A | 4/1998 | Hata | |
| 5,880,838 A | 3/1999 | Marx et al. | |
| 5,880,839 A | 3/1999 | Ishizuka et al. | |
| 5,949,546 A | 9/1999 | Lee et al. | |
| 6,020,963 A | 2/2000 | DiMarzio | |
| 6,122,036 A | 9/2000 | Yamasaki et al. | |
| 6,266,130 B1 | 7/2001 | Hasegawa et al. | |
| 6,331,885 B1 | 12/2001 | Nishi | |
| 6,486,955 B1 | 11/2002 | Nishi | |
| 6,507,326 B2 | 1/2003 | Manabe et al. | |
| 6,563,573 B1 | 5/2003 | Morohoshi et al. | |
| 6,757,066 B2 | 6/2004 | Hill | |
| 7,224,466 B2 | 5/2007 | Ray | |
| 7,298,492 B2 | 11/2007 | Tixier | |
| 7,315,380 B2 | 1/2008 | Chapman et al. | |
| 7,397,570 B2 | 7/2008 | Kawasaki et al. | |
| 7,413,310 B2 | 8/2008 | Heine | |
| 7,528,960 B2 | 5/2009 | Boesser et al. | |
| 7,897,942 B1 | 3/2011 | Bareket et al. | |
| 8,462,349 B1 | 6/2013 | Rhoadarmer et al. | |
| 2003/0007158 A1 | 1/2003 | Hill | |
| 2004/0114152 A1* | 6/2004 | Hill | G03F 7/70716 356/498 |
| 2004/0150831 A1 | 8/2004 | Ray | |
| 2005/0105855 A1 | 5/2005 | Dressler | |
| 2005/0225770 A1 | 10/2005 | Chapman et al. | |
| 2005/0270539 A1 | 12/2005 | Abbink | |
| 2006/0039005 A1 | 2/2006 | Fine et al. | |
| 2007/0041022 A1 | 2/2007 | Schluchter | |
| 2007/0085027 A1 | 4/2007 | Baxter et al. | |
| 2007/0229841 A1 | 10/2007 | Feldman | |
| 2008/0198386 A1 | 8/2008 | Hirata et al. | |
| 2009/0135430 A1 | 5/2009 | Zhu | |
| 2009/0153822 A1 | 6/2009 | Shibazaki | |
| 2010/0183987 A1 | 7/2010 | Yonekawa | |
| 2012/0249984 A1 | 10/2012 | de Boer et al. | |
| 2012/0250026 A1 | 10/2012 | de Boer et al. | |
| 2012/0250030 A1 | 10/2012 | de Boer et al. | |

FOREIGN PATENT DOCUMENTS

| | | |
|---|---|---|
| DE | 10348316 | 8/2004 |
| DE | 102004023030 A | 12/2005 |
| EP | 1174679 A2 | 1/2002 |
| EP | 0956518 B1 | 1/2004 |
| EP | 0999475 B1 | 1/2008 |
| GB | 2399186 | 9/2004 |
| JP | S60203804 A | 10/1985 |
| JP | 1184402 | 7/1989 |
| JP | 07253303 | 10/1995 |
| JP | 09-126712 | 5/1997 |
| JP | H1034385 | 8/1998 |
| JP | H11281319 | 10/1999 |
| JP | 2002141393 | 5/2002 |
| JP | 2004-228382 A | 8/2004 |
| JP | 2004239905 | 8/2004 |
| JP | 2005057222 | 3/2005 |
| JP | 2005516385 | 6/2005 |
| JP | 2006501463 | 1/2006 |
| JP | 2006170796 | 6/2006 |
| JP | 2007-121938 A | 5/2007 |
| JP | 2007-309884 A | 11/2007 |
| JP | 2007292617 | 11/2007 |
| JP | 2009115596 A | 5/2009 |
| JP | 2009-147342 | 7/2009 |
| JP | 2012500492 | 1/2012 |
| RU | 2047085 C1 | 10/1995 |
| WO | WO 03033199 A1 | 4/2003 |
| WO | 03067334 A | 8/2003 |
| WO | WO-2004031686 | 4/2004 |
| WO | WO-2010021543 | 2/2010 |
| WO | WO 2012134290 | 10/2012 |

OTHER PUBLICATIONS

Midgley, J.A. et al, "High-resolution laser homodyne interferometer", Electronics Letters, Mar. 25, 1971, vol. 7, No. 5/6.

Lee, W., "Recent developments in homodyne interferometry", Renishaw, Oct. 27, 2004.

Schattenberg, M. et al, "Metrology for the sub-100 nm domain via fiducial grids", MIT, Cambridge 2003.

Dobosz, M. et al, "Interference detection system for distance measuring interferometer", Optics & Laser Technology 44 (2012), 1620-1628, available online Dec. 20, 2011.

Steila, O. et al, "Automatic In-phase Quadrature Balancing AIQB," Oct. 2006.

Harris, et al. "Stage Position Measurement for e-beam Lithography Tool." Proc. SPIE 6517, Emerging Lithographic Technologies XI, 651710 (Mar. 15, 2007). 10 pages.

Magnan, Pierre. "Detection of Visible Photons in CCD and CMOS: A Comparative View." Nuclear Instruments and Methods in Physics Research A 504 (2003), p. 199-212. 14 pages.

"RLD10 DI (Differential Interferometer) Detector Head." L-9904-2351-04-A Data Sheet, Renishaw (2010). www.renishaw.com. 2 pages.

Non-Final Office Action mailed Feb. 13, 2015, U.S. Appl. No. 13/436,741. 12 pages.

Search Report and Written Opinion of the ISA dated Feb. 14, 2014, PCT Application No. PCT/NL2013/050691. 9 pages.

Non-Final Office Action dated Jul. 7, 2015, U.S. Appl. No. 14/716,801. 16 pages.

Chinese Office Action with English Language Translation, dated Nov. 3, 2015, Chinese Application No. 201210091968.0. 7 pages.

Japanese Office Action, dated Feb. 26, 2016, Japanese Application No. 2014-502501.

Agilent, "Lasers and Optics: User's Manual", vol. 1, (Sep. 2007), 310 pages.

Notice of Allowance for U.S. Appl. No. 14/716,801, mailed Mar. 16, 2016.

Russian Office Action with English Language Translation, dated Apr. 8, 2016, Russian Application No. 2013148110.

Japanese Office Action with English Language Translation, dated Jan. 5, 2016, Japanese Application No. 2014-502500.

Office Action dated Mar. 23, 2016, U.S. Appl. No. 14/431,765.

Decision on Grant in Russian Application No. 2013148110 dated Nov. 21, 2016, with English translation. 18 pages.

Notice of Allowance in U.S. Appl. No. 14/431,765 mailed Sep. 12, 2016. 14 pages.

Office Action in Japanese Application No. 2015-534420 mailed Nov. 8, 2016, with English translation. 14 pages.

Office Action in Taiwanese Application No. 101111339 issued Jun. 15, 2016, with English translation. 11 pages.

* cited by examiner

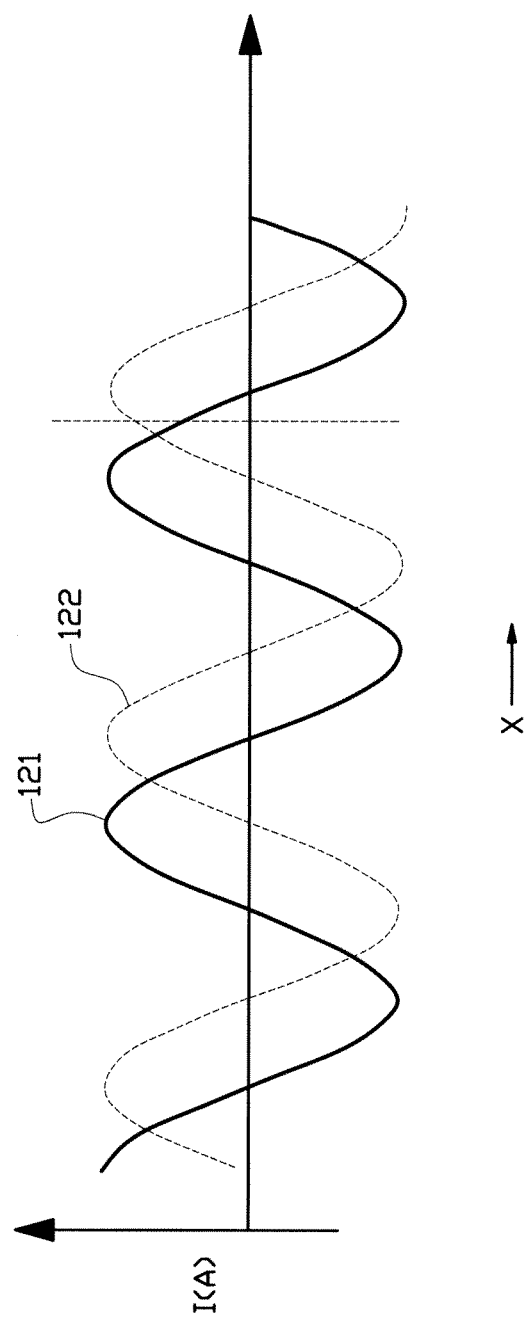

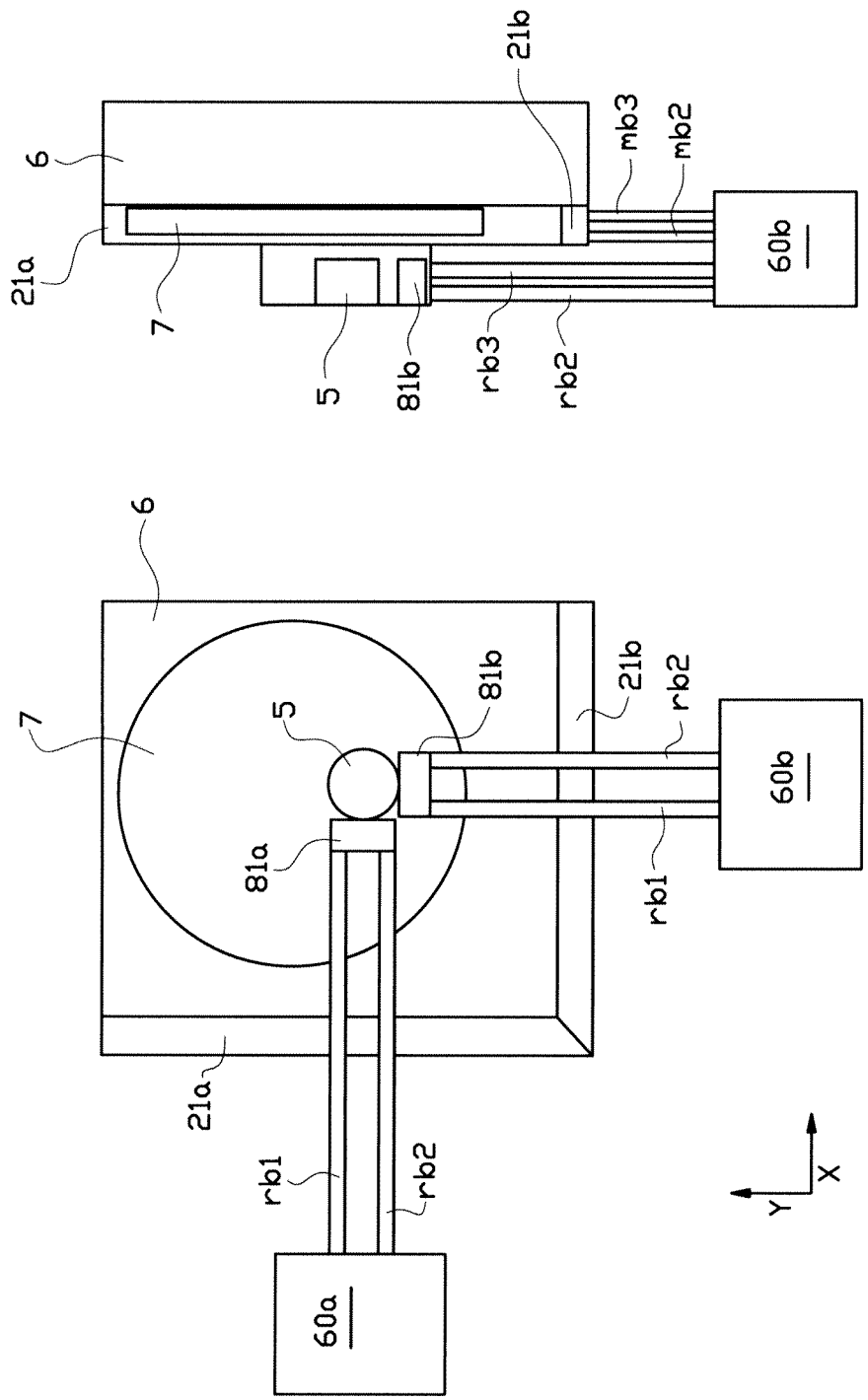

LITHOGRAPHY SYSTEM WITH DIFFERENTIAL INTERFEROMETER MODULE

BACKGROUND

The invention relates to a lithography system comprising an optical column wherein the interferometer is adapted for measuring a displacement, a moveable target carrier for displacing a target such as a wafer, and a differential interferometer, between a mirror provided on the optical column and a mirror provided on the target carrier. The present invention further relates to an interferometer module and method for measuring such a displacement.

A typical problem with interferometer based measurement systems is that small errors in the reflective surface of a mirror, for instance due to mirror unflatness and/or due to thermal expansion of the target carrier or optical column, result in displacement measurement errors due to Abbe and Cosine errors. Displacement errors negatively affect alignment precision needed for instance for stitching or overlay of a pattern.

Errors in Rz rotation of the optical column are especially a factor of importance in lithography system in which the orientation of the optical column, in particular of a projection lens optics thereof, substantially defines the orientation of the image projected thereby on a target. An example of lithography systems thus influenced is a multiple beam exposure system, in particular multiple charged particle beam exposure systems, in which each of the multiple beams is focused individually on a target by a projection lens array. In such a systems errors in Rx and/or Ry of the projection lens optics lead to focus errors when projecting an image onto a target exposure surface.

U.S. Pat. No. 7,224,466 provides a compact differential interferometer for measuring a displacement between a measurement mirror and a reference mirror along two axes. The interferometer uses shared measurement and reference beams that respectively reflect from measurement and reference reflectors before that shared beams are split into individual beams corresponding to the measurement axes of the interferometer. Though this interferometer emits three coplanar measurement beam spots on the measurement mirror and three corresponding coplanar reference beam spots on the reference mirror, movement along only the two measurement axes is measured.

U.S. Pat. No. 6,486,955 provides a system comprising a number of differential interferometers, some of which are used to track a displacement of a chuck mirror relative to a projection optics mirror along an X-direction as well as a rotation around an axis along a Z-direction. Additional interferometers are provided to measure displacement of the chuck mirror relative to the projection optics mirror along a Y-direction, tilt of the chuck relative to the projection optics around an axis along the X-direction and tilt of the chuck relative to the projection optics along the Y-direction respectively.

Thus, at least four interferometers are required to obtain information on displacement along the X-direction, the Y-direction and on tilt along the X-direction and Y-direction as well as a rotation along the Z-direction. This large number of interferometers increases complexity of the system and substantially increases downtime of the system needed for adjusting and/or replacing the interferometers.

It is an object of the present invention to provide a lithography system requiring fewer interferometers for obtaining information on relative displacement and rotation between a target carrier and an optics column.

SUMMARY OF THE INVENTION

According to a first aspect, the present invention provides a method for measuring a relative displacement between a first mirror and a second mirror in a lithography system, wherein said first mirror is connected to an exposure tool of said system and said second mirror is connected to a target to be exposed by said system, wherein said first mirror is moveable relative to said second mirror, said method comprising the steps of a) generating three coherent beams, b) splitting said beams up into three measurement beam and an associated reference beam pairs, wherein said beams are split using a unitary beam splitter, c) directing said three measurement beams to be incident on said first mirror to be reflected thereby, wherein said three measurement beams are non-coplanar, directing said three reference beams to be incident on said second mirror to be reflected thereby, wherein said three reference beams are non-coplanar, wherein said three reference beams and said three measurement beams incident on said first and second mirror respectively are all substantially parallel to each other, d) combining said three reflected measurement beams with their three associated reflected reference beams to provide three combined beams, e) projecting each of said combined beams onto a corresponding beam receiver, each receiver adapted for converting a beam into a signal representative of a change in position and/or orientation of the first mirror relative to the second mirror.

The exposure tool to which the first mirror is connected for instance comprises an optical column of the lithography system. By using a single optical element, i.e. the unitary beam splitter, for splitting three coherent beams into three measurement and associated reference beam pairs, a compact interferometer module may be constructed for providing said signals representative of a change in position and/or orientation of the first mirror relative to the second mirror. From these signals, a relative displacement along one axis, e.g. the X-axis, and a rotation around two other axis, e.g. around Rz and Ry, may be derived.

Preferably each measurement beam and/or reference beam is reflected only once in the first and/or second mirror respectively, minimizing loss of light due to reflection. Thus a low-power light source may be used.

In an embodiment in step d) a unitary beam combiner is used for providing said three combined beams, reducing the number of optical elements required for performing the method. Preferably, the unitary beam splitter and the unitary beam combined are the same optical element.

In an embodiment a first incident measurement beam and a second incident measurement beam span a first plane and the second incident measurement beam and a third incident measurement beam span a second plane at an angle $\alpha$ to the first plane, and a first incident reference beam and a second incident reference beam span a third plane and the second incident reference beam and a third incident reference beam span a fourth plane at substantially the same angle $\alpha$ to said third plane. The three measurement beams and the three reference beams are thus emitted in the said angular orientation, facilitating combining said measurement beams and reference beams into corresponding combined beams.

In an embodiment said angle $\alpha$ is 90°. The three reference beams and the three measurement beams thus each span an L-shape.

In an embodiment the second plane and the fourth plane substantially coincide. Two measurement beams and corresponding reference beams are thus co-planar with each other but not in a same plane as the remaining measurement beam and corresponding reference beam.

In an embodiment the three incident measurement beams are substantially parallel to each other and/or the three incident reference beams are substantially parallel to each other.

In an embodiment each of said three incident measurement beams is substantially parallel to its associated incident reference beam.

In an embodiment said three coherent beams are generated from a single beam.

In an embodiment the method comprises the additional step of converting an intensity of a combined beam to an electrical signal at said beam receivers, said beam receivers preferably each comprising a photo-diode, said beam receivers more preferably each consisting of a photo-diode.

In an embodiment a first reference beam and a second reference beam are emitted at a distance from each other which is equal to a distance between a first measurement beam and a second measurement beam, said first reference beam and a third reference beam are emitted at a distance from each other equal to a distance between said first measurement beam and a third measurement beam, and said second reference beam and a third reference beam are emitted at a distance from each other equal to a distance between said second measurement beam and said third measurement beam.

In an embodiment said measurement beams are emitted onto the first mirror at the level of said target. In an embodiment a measurement beam and a reference beam of a pair of said measurement and associated reference beam pairs are emitted at a distance of 4 mm or less from each other, preferably at a distance of 2 mm or less, more preferably at a distance of 0.5 mm.

In an embodiment the method is performed using an differential interferometer module, wherein said module comprises: a beam source adapted for generating said three coherent beams, a unitary beam splitter adapted for splitting said three beam into said respective pairs of measurement beams and associated reference beams, at least one beam combiner for combining said three reflected measurement beams with their associated three reflected reference beams to three corresponding combined beams, and three beam receivers for receiving said combined beams. A single, compact differential interferometer module may thus be used to measure a displacement between said first mirror and said second mirror along three non-coplanar measurement axes.

According to a second aspect the present invention provides a lithography system comprising a frame, an optical column for projecting a pattern onto a target, said optical column mounted to said frame, a target carrier for moving said target relative to the optical column, wherein the target carrier is provided with a first mirror, and wherein the optical column is provided with a second mirror, one or more differential interferometer modules for generating one or more signals representative of a displacement of the target carrier relative to the optical column, wherein each of said differential interferometer modules comprises a beam source adapted for providing three coherent beams, each of said one or more interferometer modules further comprising a beam splitter unit adapted for splitting said three beams up in three respective measurement beam and associated reference beam pairs, wherein said three measurement beams are incident on and reflected back by the first mirror, and wherein the three reference beams are incident on and reflected back by the second mirror, at least one beam combiner for combining said three reflected measurement beams with their associated three reflected reference beams into three combined beams, and three beam receivers, wherein each of said three combined beams is projected onto a corresponding beam receiver.

The differential interferometer module of the system is adapted for emitting three measurement beams towards the mirror of the target carrier, and three associated reference beams towards the mirror of the projection optics, and combining the respective reflected measurement beams and associated reflected reference beams on three light receiving units. Thus only a single module is required to provide three differential measurement signals. Alignment of the beams emitted by the module is preferably carried out when the module is outside of the lithography system. Thus, once the module is aligned with the frame all beams are aligned as well, obviating the need for individually aligning measurement or reference beams when the module is mounted to the frame. The coherent beams are internally coherent but are not necessarily coherent with respect to each other. The combined beams are formed by reflected reference and associated reflected measurement beams, which at least partially coincide at their corresponding beam receiver.

It will be appreciated that the target carrier may comprise any device for moving a target relative to the optical column. The target carrier may for instance comprise one or a combination of a wafer table, a chuck, a stage.

In an embodiment said beam splitter unit comprises a single beam splitter for splitting said three beams into said three measurement beam/reference beam pairs. Thus the module is not an assembly of three separate interferometers, but rather a single module in which three beams are split using a single beam splitter. In this embodiment the alignment of the three reference beams and the three measurement beams may be effected by single alignment of said splitter. Moreover, as the beam splitter is fixedly connected to the module, said reference and measurement beams may be aligned within the lithography system simply by aligning said module in the system. Preferably the beam splitter also functions as a beam combiner for reflected reference and measurement beams.

In an embodiment a first incident measurement beam of said three measurement beams and a second incident measurement beam of said measurement beams span a first plane and the second incident measurement beam and a third incident measurement beam of said measurement beams span a second plane at an angle $\alpha$ to the first plane, and a first incident reference beam of said reference beams and a second incident reference beam of said reference beams span a third plane and the second incident reference beam and a third incident reference beam of said reference beams span a fourth plane at substantially the same angle $\alpha$ to said third plane. The reference beams and the measurement are thus emitted towards the second and first mirror respectively in similar configurations, simplifying construction of the module.

In an embodiment said angle $\alpha$ is 90°, further simplifying construction of the module.

In an embodiment wherein the second plane and the fourth plane substantially coincide.

In an embodiment the three incident measurement beams are substantially parallel to each other and/or the three incident reference beams are substantially parallel to each other. When the first and/or second mirror comprises a substantially smooth planar reflective surface, the reflected measurement and reference beams respectively may thus be reflected back towards the module, in particular towards the beam combiner of the module.

In an embodiment each of said three incident measurement beams is substantially parallel to its associated incident reference beam.

In an embodiment each of said three incident measurement beams is substantially parallel to its associated incident reference beam.

In an embodiment the beam source comprises an optical fiber. The optical fiber is preferably connected to a laser emitter arranged outside of the module, in particular outside of a vacuum chamber of the lithography system. Introduction of electrical fields close to the optical column is thus avoided.

In an embodiment the beam source comprises or is connected to multiple distinct emitters for said three coherent light beams. The beam source may for instance comprise three optical fibers, each of said fibers connected to a different laser emitter exterior to the module.

In an embodiment the beam source comprises a single beam emitter for providing a single beam and a beam splitter for splitting said single beam into three beams.

In an embodiment the one or more signals provided by the interferometer module comprise a signal provided by a beam receiver.

In an embodiment the beam receivers comprise beam intensity detectors adapted for converting an intensity of a combined beam to an electrical signal, said beam receivers preferably each comprising a photo-diode. In a preferred embodiment said beam receivers each consist of a photo-diode. Preferably, said electrical signal is not amplified within the module, further allowing a simple construction of the module and reducing generation of electrical fields by said module. The one or more signals provided by the interferometer module thus comprise an electrical signal generated by a beam receiver.

In an embodiment the beam receivers comprise fiber ends of optical fibers leading out of the module, preferably out of a vacuum chamber of the system in which the module is placed. Thus the module may output no electrical signals. The one or more signals provided by the interferometer module thus comprise an optical signal received by a beam receiver.

In an embodiment said target carrier is moveable in a first direction of movement and in a second direction of movement substantially perpendicular to said first direction, wherein said at least one differential interferometer module is adapted for generating a signal representative of a displacement of the first mirror relative to said second mirror along said first direction, wherein said optical column has an optical axis, wherein said at least one differential interferometer module is further adapted for providing a signal representative of a rotation between the first mirror and the second mirror around said an axis parallel to said optical axis, as well as for providing a signal representative of a rotation between the first mirror and the second mirror around an axis parallel to said second direction of movement. Thus, using a single module which has to be aligned only once with respect to the frame, at least three relative measurements can be made representative of a displacement or change in rotation between the first mirror and the second mirror.

In an embodiment said module is adapted for emitting said reference beams and said measurement beams, a distance between a first reference beam and a second reference beam being equal to a distance between a first measurement beam and a second measurement beam, a distance between a first reference beam and a third reference beam being equal to a distance between a first measurement beam and a third measurement beam, and a distance between a second reference beam and a third reference beam being equal to a distance between a second measurement beam and a third measurement beam. The beams are thus emitted in similar spatial configurations.

In an embodiment the first mirror is arranged on the target carrier to reflect the incident measurement beams at the level of said target, preferably close to an exposure surface of said target. A measured rotation of the first mirror relative to the second mirror thus is representative of a rotation between the target relative to the optical column, in particular the projection optics thereof.

In an embodiment the secondary beam splitter is arranged for providing at least one incident reference beam and at least one incident measurement beam at a distance of 4 mm or less from each other, preferably at a distance of 2 mm or less, more preferably at a distance of 0.5 mm. Thus the relative displacement and rotation between the optical column and the target can be accurately estimated. This is especially advantageous when the optical column comprises a focussing array for focusing multiple exposure beamlets onto a target. The distance referred to is preferably a distance when projected onto the second and first mirror respectively. Alternatively the distance referred to may be the distance between said beams as they are emitted from the module.

In an embodiment the system further comprises a vacuum chamber, wherein said one or more interferometer modules is mounted to the frame within said vacuum chamber.

In a system according to this embodiment an entire differential interferometer module may be mounted or replaced within the vacuum chamber, without having to align the beam splitter and/or beam combiner of the module. Downtime of the system is thus reduced.

In an embodiment said one or more interferometer module is mounted to said frame by means of a kinematic mount. Expansion of the frame and/or the module, for instance due to thermal expansion thereof, thus does not substantially affect the alignment of the module. Moreover, further calibration of the module once it has been mounted is no longer required as it may be mounted on the frame with high positional accuracy.

In an embodiment said differential interferometer module is a first differential interferometer module for measuring displacement of the target carrier along a first direction, said system further comprising a second differential interferometer module for measuring displacement of the target carrier along a second direction perpendicular to the first direction, said first and second directions defining a plane of movement for the target carrier, wherein the first differential interferometer module is further adapted for providing a signal representative of the rotation along an axis parallel to the second direction, and wherein the second differential interferometer module is further adapted for providing a signal representative of a rotation along an axis parallel to the first direction. The first and second directions are typically denoted the X and Y directions, and a direction perpendicular to the X and Y directions is typically denoted the Z direction. Thus, using only two differential interferometers the system may provide information on displacement of a target carrier relative to an optical column in the first and second directions, as well as information on relative rotation Rx,Ry and Rz between the target carrier and optical column along axes perpendicular the X,Y and Z directions.

In an embodiment the beam sources of the first and second differential interferometer modules are connected via an optical fiber to a single beam emitter, such as a laser emitter. Thus a single coherent light source may be used to provide the coherent beams for both differential interferometer modules.

In an embodiment the beam sources of the first and second differential interferometer modules each comprise a separate beam emitter, preferably a low power laser emitter. In this embodiment, the accuracy of the measurements may be increased as low power beam emitters having a high signal to noise ratio may be used.

In an embodiment said system further comprises actuators for moving and/or changing the orientation of the projection optics of the optical column relative to the frame. The system preferably comprises a control unit adapted for controlling the actuators unit to move and/or change the orientation of the projection optical relative to the frame based on signals generated by said one or more differential interferometer modules.

In an embodiment said system is a multiple beam system, the optical column comprising a plurality of focusing elements for focusing said multiple beams on said target.

In an embodiment said system is a charged particle multiple beam system, wherein the plurality of focusing elements comprises a plurality of electrostatic lenses.

According to a third aspect the present invention provides a differential interferometer module comprising a beam source adapted for providing three coherent beams, a beam splitter unit adapted for splitting said three beam into respective pairs of measurement beams and associated reference beams, wherein the three measurement beams are incident on a first mirror, and wherein the three reference beams are incident on a second mirror moveable with respect to said first mirror, at least one beam combiner for combining each reflected measurement beam with its associated reflected reference beam to a combined beam, and three beam receivers, wherein each combined beam is projected onto a corresponding beam receiver. In an embodiment said beam splitter unit comprises a single beam splitter for splitting said three beams into three measurement beam/reference beam pairs.

In an embodiment said three beam receivers each comprise an intensity detector for detecting an intensity of a corresponding combined beam. Preferably the intensity detector is adapted for converting an intensity signal into an electrical signal In an embodiment the beam splitter unit is adapted for emitting said three measurement beams non-coplanarly, and/or for emitting said three reference beams non-coplanarly.

In an embodiment a first incident measurement beam and a second incident measurement beam span a first plane and the second incident measurement beam and a third incident measurement beam span a second plane at an angle α to the first plane, and a first incident reference beam and a second incident reference beam span a third plane and the second incident reference beam and a third incident reference beam span a fourth plane at substantially the same angle α to said third plane.

In an embodiment said angle α is 90°. In an embodiment the second plane and the fourth plane substantially coincide.

In an embodiment the three incident measurement beams are substantially parallel to each other and/or wherein the three incident reference beams are substantially parallel to each other.

In an embodiment each of said three incident measurement beams is substantially parallel to its associated incident reference beam.

In an embodiment said first and second mirror are spaced apart from said module.

In an embodiment the inside of said module is substantially filled with a solid material, preferably a cured epoxy-resin, more preferably Stycast®.

In a preferred embodiment the beam splitter and the beam combiner form a single integrated unit. In other words, the beam splitter is also adapted for functioning as a beam combiner and vice versa.

According to a fourth aspect the present invention provides a lithography system comprising a frame and an interferometer module adapted for emitting at least one beam and for receiving a reflection thereof, wherein the interferometer module is mounted on said frame, and wherein said interferometer module is mounted on said frame by means of a kinematic mount. The kinematic mount preferably comprises three kinematic balls fixedly attached to the interferometer module. The kinematic mount preferably further comprises a stop element for abutting said kinematic balls, wherein the stop element is fixedly attached to said frame. The interferometer module preferably is an interferometer module as described above.

According to fifth aspect, the present invention provides a method for calibrating an interferometer module for use in a lithography system comprising a frame provided with a stop element, said module comprising three kinematic balls for abutting said stop element, said method comprising the steps of: calibrating the interferometer module in reference to said kinematic balls, outside of said lithography system, and mounting the calibrated interferometer in the lithography system by placing the kinematic balls against the stop element of said frame.

As the stop element of the frame has a fixed position and orientation, a calibrated interferometer module may be mounted in the system without requiring further alignment. Down times of the system during maintenance or replacement of an interferometer module are reduced as time consuming calibration of the module is substantially carried out when the module is exterior to the lithography system.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 4B shows a graph of signals obtained using a differential interferometer of FIG. 4A, FIGS. 5A and 5B show a top view and a side view respectively of a lithography system comprising two interferometer modules according to the present invention.

DETAILED DESCRIPTION OF THE INVENTION

Figure 1A:
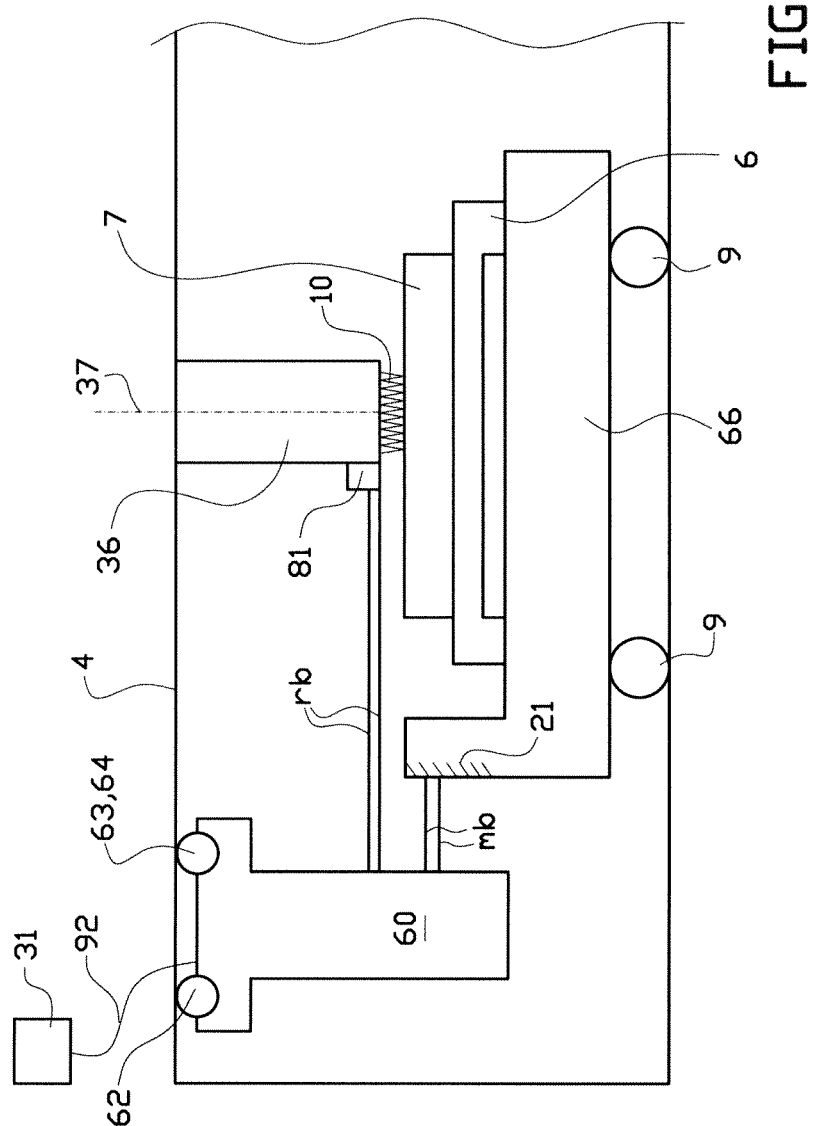
FIGS. 1A and 1B show schematic side views of a lithography system according to the present invention.

FIG. 1A shows a lithography system 1 according to the present invention. The system comprises a frame 4, to which an optical column 36 having an optical axis 37 is mounted. The optical column is adapted for projecting a plurality of exposure beamlets 10 onto a target 7. By selectively switching selected exposure beamlets on or of, an exposure surface of the target below the optical column may be patterned. The target is placed on a wafer table 6, which in turn is placed on a chuck 66 which is moveable with respect to the optical column 36 by means of a stage 9 on which the chuck 66 is placed. In the embodiment shown, the chuck, wafer table and stage form a target carrier for moving the target 7 relative to the optical column 36.

The chuck 66 comprises a first mirror 21, comprising a substantially planar surface at substantially the same level or height within the system as the target 7 or exposure surface thereof. The optical column comprises a second mirror 81, which comprises a substantially planar surface close to the projection end of the optical column.

The system further comprises a modular interferometer head 60, or differential interferometer module, which is mounted to the frame 4 by means of a kinematic mount 62,63,64. The modular interferometer head 60 emits reference beams Rb onto the second mirror 81, and associated measurement beams Mb onto the first mirror 21. Though not shown in this figure, the reference beams comprise three reference beams, and the measurement beams comprise three measurement beams, and a relative movement between the first mirror 81 and second mirror 21 is measured by evaluating an interference between a reference beam and its associated measurement beam.

The three measurement beams Mb and the three reference beams Rb originate from a laser unit 31 which supplies a beam of coherent light, and which is coupled into the interferometer module 60 via an optical fiber 92 which forms part of a beam source for the module 60.

Figure 1B:
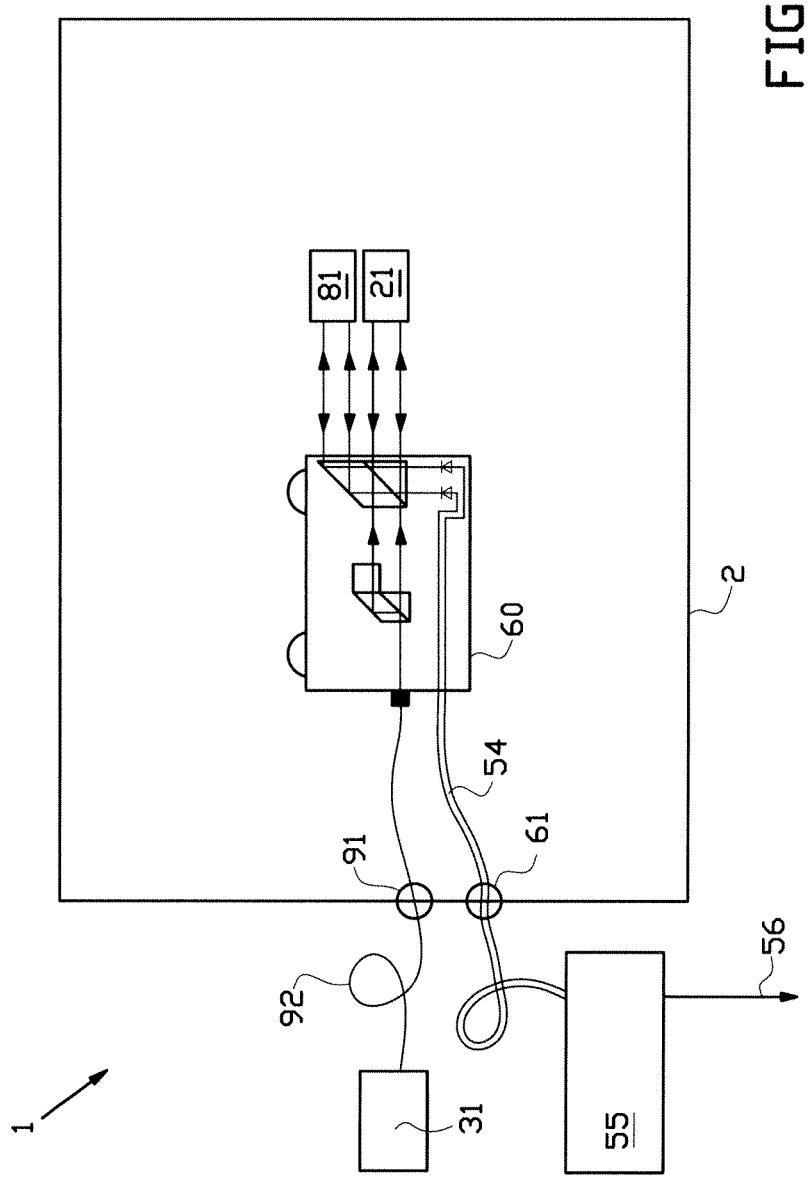

FIG. 1B schematically shows the lithography system 1 of FIG. 1A, wherein the lithography system comprises a vacuum housing 2. Within the vacuum housing 2, only the interferometer head 60 and its connections, and first 81 and second mirrors 21 are shown, though it will be understood that the target carrier of FIG. 1A will be contained within the vacuum chamber 2 as well. The optical fiber 92 from laser 31 passes through a wall of said vacuum chamber 2 through a vacuum feed-through 91. Signals representative of interference between measurement beams and their associated reference beams are transported from the interferometer module 60 out of the vacuum chamber 2 via signal wires 54, which pass through vacuum feed-through 61.

Figure 1C:
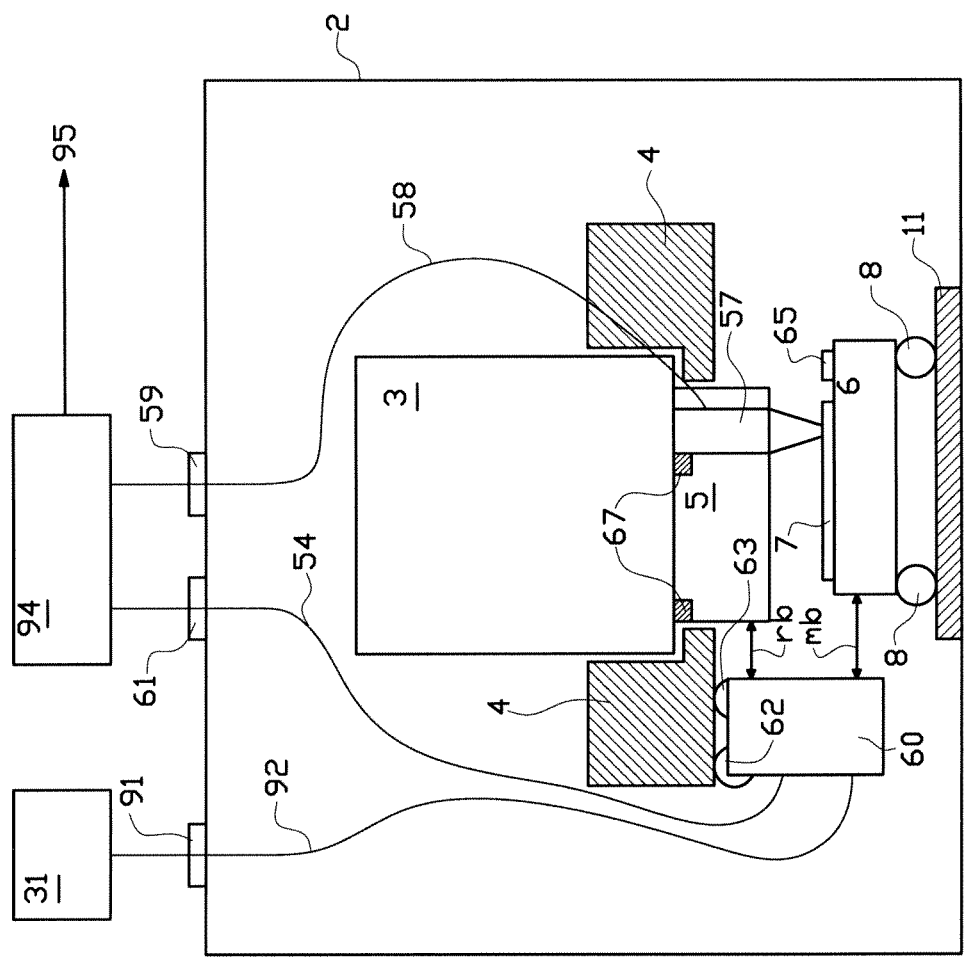
FIG. 1C shows a schematic side view of a further embodiment of a lithography system according to the present invention.

FIG. 1C schematically shows a lithography system similar to the system shown in FIG. 1A, wherein the system is a charged particle beam lithography system comprising electron optics 3 for providing a plurality of charged particle beamlets, and wherein the projection optics 5 comprise a plurality of electrostatic lenses for individually focusing said charged particle beamlets onto an exposure surface of the target 7. The projection optics comprises actuators 67 for adjusting an orientation and/or position of the projection optics relative to the frame 4. The system further comprises a signal processing module 94 adapted providing a position and/or displacement signal to a stage control unit 95 for controlling movement of a stage 11. Signals are transmitted from the interferometer module 60 and the alignment sensor 57 via signal wires 54,58 which pass through vacuum feed-throughs and 59, to the signal processing module 94, which processes these signals to provide a signal for actuating the stage 11 and/or the projection optics 5. The displacement of the wafer table 6, and thus of the target 7 supported thereby relative to projection optics 5 is thus continuously monitored and corrected.

In the embodiment shown, the wafer table 6 is supported by a moveable stage 11 via a kinematic mount 8, and the stage 9 may be moved relative to the projection optics 5 in a direction towards or away from the interferometer module 60. The differential interferometer module 60 emits three reference beams towards a mirror on the projection optics, and emits three measurement beams towards a mirror on the wafer table.

Figure 2A:
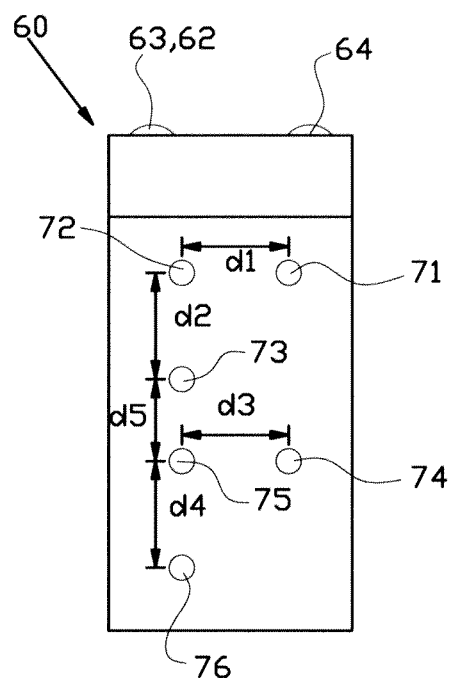
FIGS. 2A and 2B show a schematic side view and an isometric view respectively of a differential interferometer module according to the present invention.
Figure 2B:
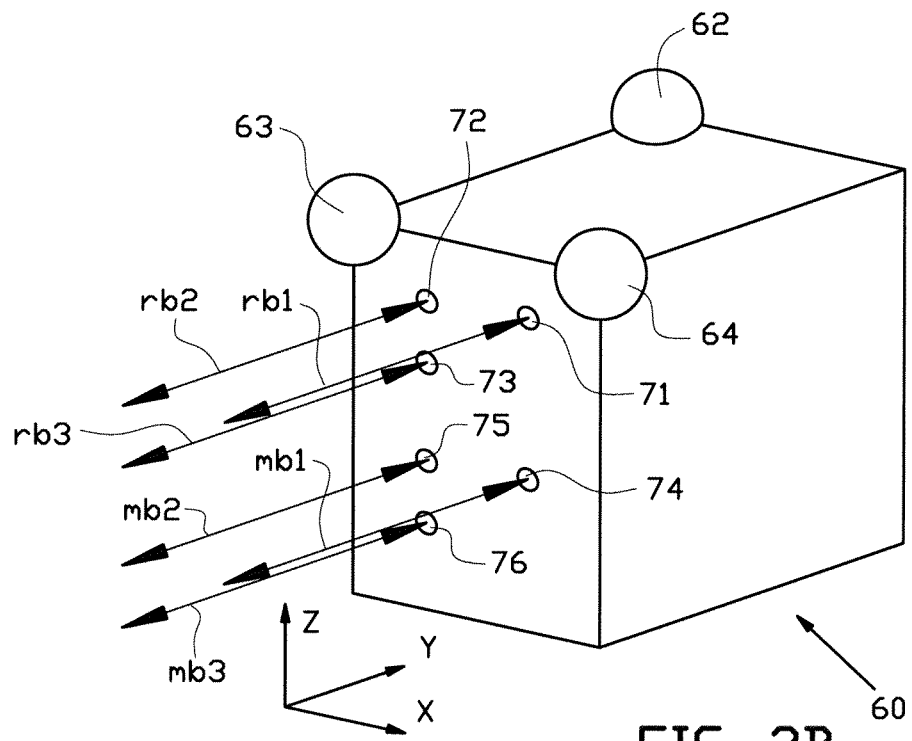

FIGS. 2A and 2B shows a front view and an isometric view respectively of the interferometer module of FIG. 1A. The interferometer module 60 comprises a kinematic mount 62,63,64 for easy and highly precise alignment of the module during mounting of the module on the frame. The interferometer module comprises three holes 71,72,73 for emitting three corresponding reference beams rb1,rb2,rb3, as well as for receiving reflections thereof back into the module. The interferometer module further comprises three holes 74,75,76 for emitting three corresponding measurement beams mb1,mb2,mb3, as well as for receiving reflections thereof back into the module. Hole 73 for emitting a reference beam is located at a distance d5 of 4 mm from hole 75 for emitting a measurement beam. Holes 71 and 72 are spaced apart by a distance d1, holes 72 and 73 by a distance d2, holes 74 and 75 by a distance d3 equal to distance d1, and holes 75 and 76 by a distance d4 equal to distance d2. In the embodiment shown the distances d1,d2,d3,d4 and d5 are center-to-center distances equal to 12, 5, 12, 5 and 4 millimeter respectively. In FIG. 2B in can be seen that the first reference beam rb1 and second reference beam rb2 span a first plane, and the second reference beam rb2 and third reference beam rb3 span a second plane, wherein the second plane is at an angle α (not shown) of 90 degrees with respect to the first plane. Likewise, the first measurement beam mb1 and second measurement beam mb2 span a third plane, and the second measurement beam mb2 and third measurement beam mb3 span a fourth plane, wherein the third plane is at substantially the same angle α (not shown) with respect to the fourth plane.

Figure 3A:
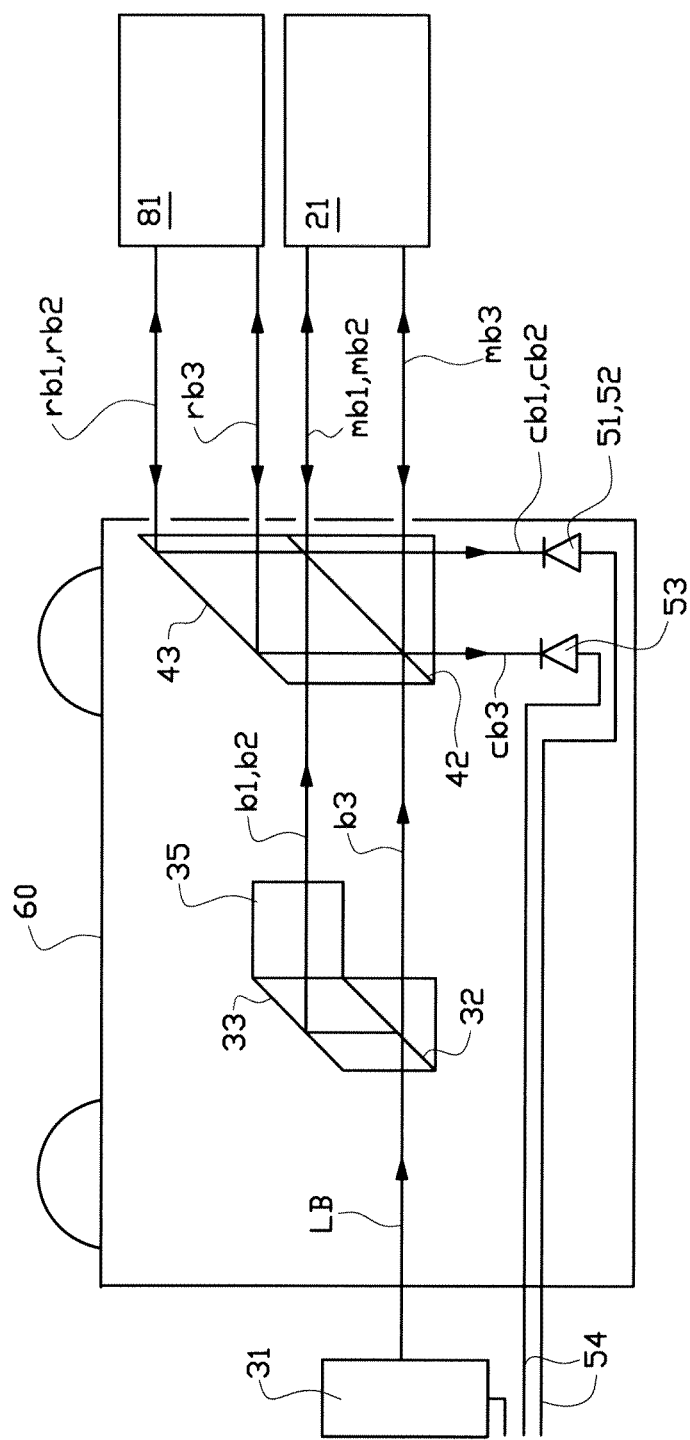
FIGS. 3A and 3B show a cross-sectional side view and a cross-sectional top view a an differential interferometer module according to the invention.
Figure 3B:
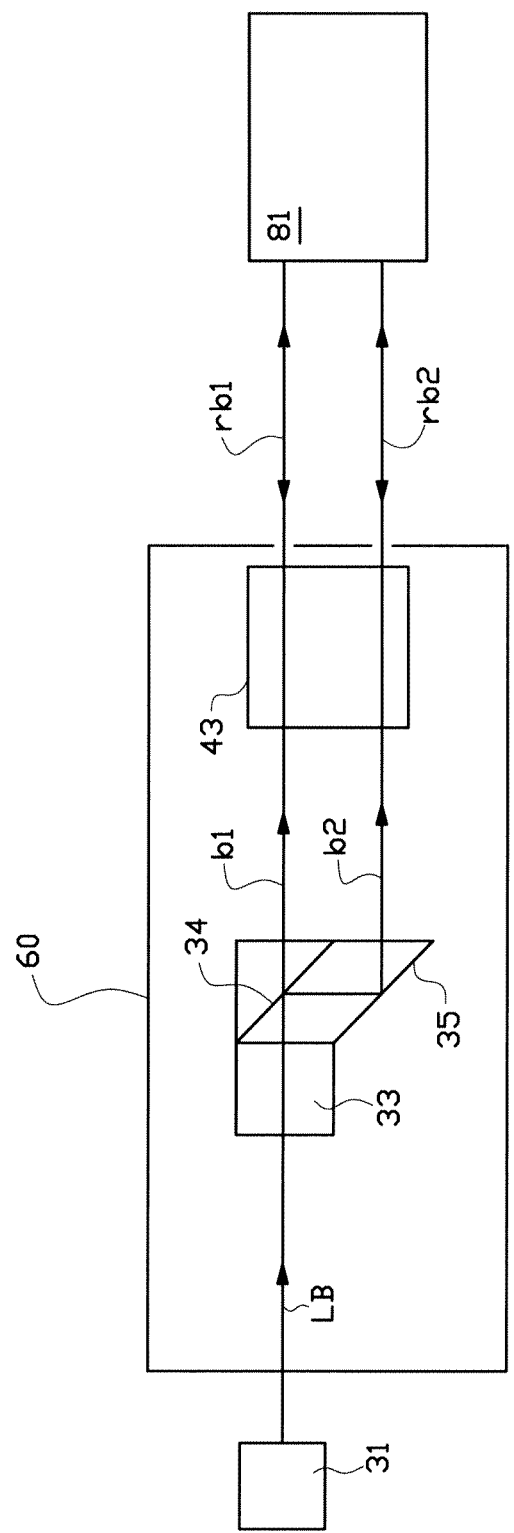

FIGS. 3A and 3B show a schematic side view and top view respectively of an embodiment of the differential interferometer module 60 according to the present invention. The module comprises a primary beam splitter unit 32,33, 34, for splitting a laser beam LB emitted by laser unit 31 up into three coherent light beams b1,b2,b3. The primary beam splitter unit shown is a unit comprising two beam splitters 32,34 and two reflecting prisms 33,35. Each of the coherent light beams b1,b2,b3 are then emitted toward a secondary beam splitter unit 42,43, adapted for splitting said three coherent light beams b1,b2,b3 up into respective measurement and associated reference beam pairs. The first of these pairs comprises measurement beam rb1 and associated reference beam rb1, the second of these pairs comprises measurement beam rb2 and associated reference beam rb2, and the third pair comprises measurement beam rb3 and associated reference beam rb3.

Thus 6 beams are emitted from the secondary beam splitter unit, three reference beams rb1,rb2,rb3 and three associated measurement beams mb1,mb3,mb3.

The reference beams rb1,rb2,rb3 are emitted incident on second mirror 81 of the optical column, while the measurement beams mb1,mb2,mb3 are emitted incident on first mirror 21 of the target carrier. The reference and measurement beams are reflected back into the module 60, in particular back into secondary beam splitter unit 42,43, which acts as a beam combiner 42,43 for the reflected measurement beams and their associated reference beams. The beam combiner thus emits three combined beams cb1,cb2,cb3, wherein each of said combined beams is formed by a reflected measurement beam and its associated reference beam at least partially overlapping at corresponding light receivers 51,52,53, in this case light intensity detectors 51,52,53 comprising photo-diodes. A changing interference of the measurement beams and associated reference beams at any of the beam receivers results in a change in the light intensity at that beam receiver. The photo-diodes convert a light intensity signal to an electrical signal, which is fed out of the module 60 unamplified.

Figure 4A:
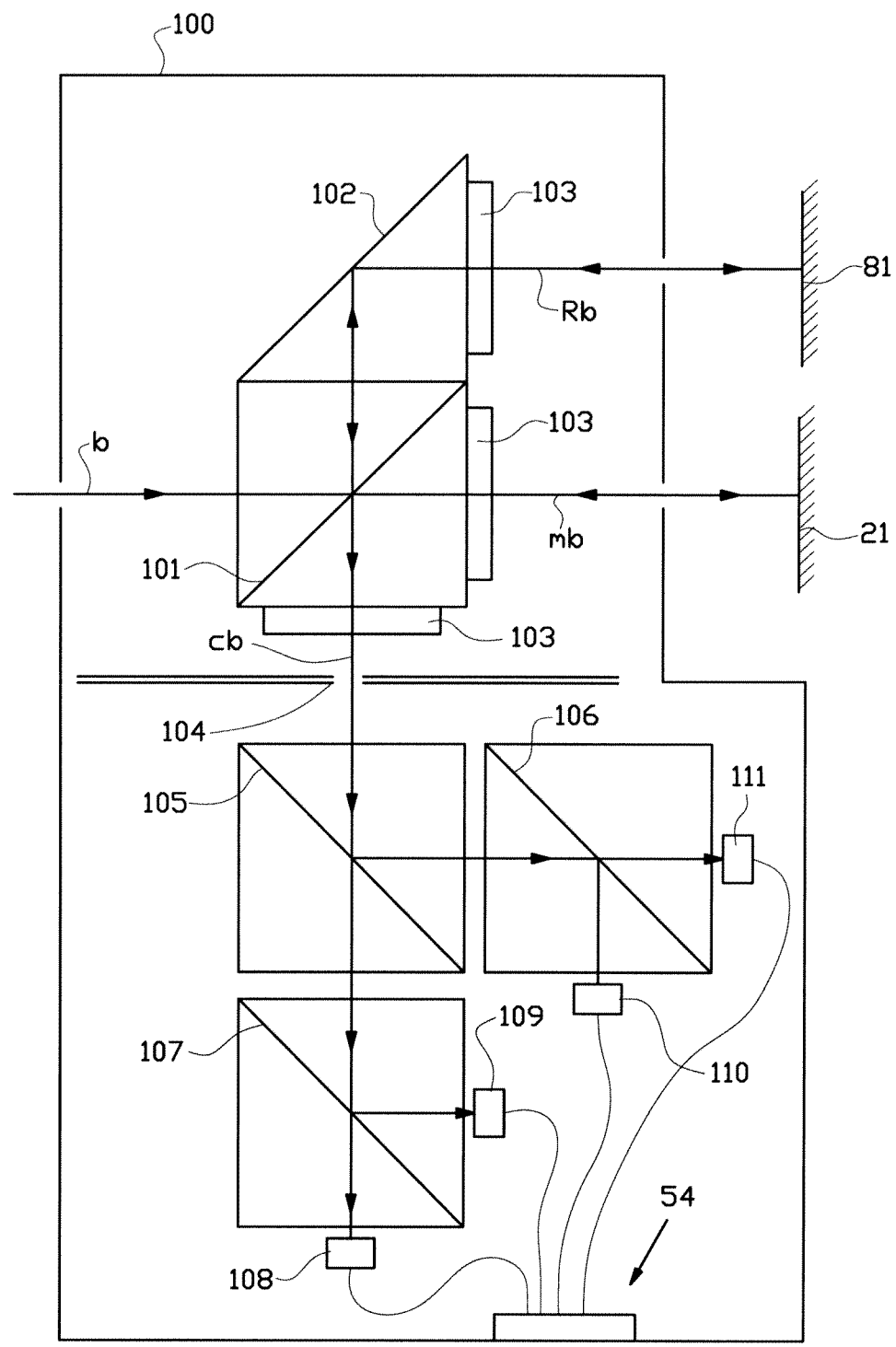
FIG. 4A shows a detail of a beam splitter and a combined beam receiving as used in a differential interferometer according to the invention.

FIG. 4A shows a detail of a preferred embodiment of an interferometer head 100 according to the present invention. A single coherent beam b is emitted onto polarizing beam splitter 101, which splits the beam b into a polarized measurement beam Mb and an associated polarized reference beam Rb. After having passed the polarizing beam splitter 101, the measurement beam Mb passes a quarter wave plate 103. The incident measurement beam is then reflected back by first mirror 21, and again passes the quarter wave plate 103. Subsequently the reflected measurement beam is reflected through an iris 104 by the polarizing beam splitter 101.

Similarly, the part of the coherent beam that forms the reference beam Rb is reflected by prism 102 through a quarter wave plate 103 and incident on second mirror 81. The reference beam Rb is then reflected back by mirror 81 and again passes through the same quarter wave plate 103, after which it is reflected by prism 102, through polarizing beam splitter 101 towards iris 104.

Thus, when the interferometer is active, a combined beam Cb passes the iris 104. A non-polarizing beam splitter 105 splits the combined beam up into two, wherein the two combined beam portions into which the combined beam is split up comprise both a portion of the reflected reference beam and a portion of the reflected measurement beam. The two beam portions in turn are split up by polarizing beam splitters 106 and 107 respectively. The polarizing beam splitter 106 is rotated 45 degrees with respect to polarizing beam splitter 107. Thus four distinct combined beam portions result, having a parallel polarization, a perpendicular polarization, a 45 degree polarization and a 135 degree polarization respectively.

Detectors 108,109,110 and 111, convert intensities of these four combined beam portions into a first signal sig1, a second signal sig2, a third signal sig3 and a fourth signal sig4 respectively.

FIG. 4B shows a graph of a difference between said signals sig1 and sig2, and of a difference between said signals sig3 and sig4 as a wafer table, or target carrier, is moved at a constant velocity with respect to the projection optics. The graph shows two sinusoidal curves 121, 122 that are used to determine a wafer table displacement and thus the wafer table position.

When only a single sinusoid curve is available, it may be difficult to determine a direction of relative movement when a change in intensity from a peak level to a lower level occurs, as both movement of the wafer table towards and away from the optical column will result in a lower intensity signal. According to the present invention, a direction of movement can be determined at any time by using two sinusoid curves that are out of phase with respect to each other, for instance out of phase by 45 degrees. A further advantage of using two curves instead of one is that measurements may be carried out more accurately. For instance, when a peak is measured for curve 121, a small movement to either side will result in a small change in measured intensity signal of the curve. However, the same small movement results in a large change in measured intensity signal of curve 122, which may then be used to determine the displacement instead.

Figure 4C:
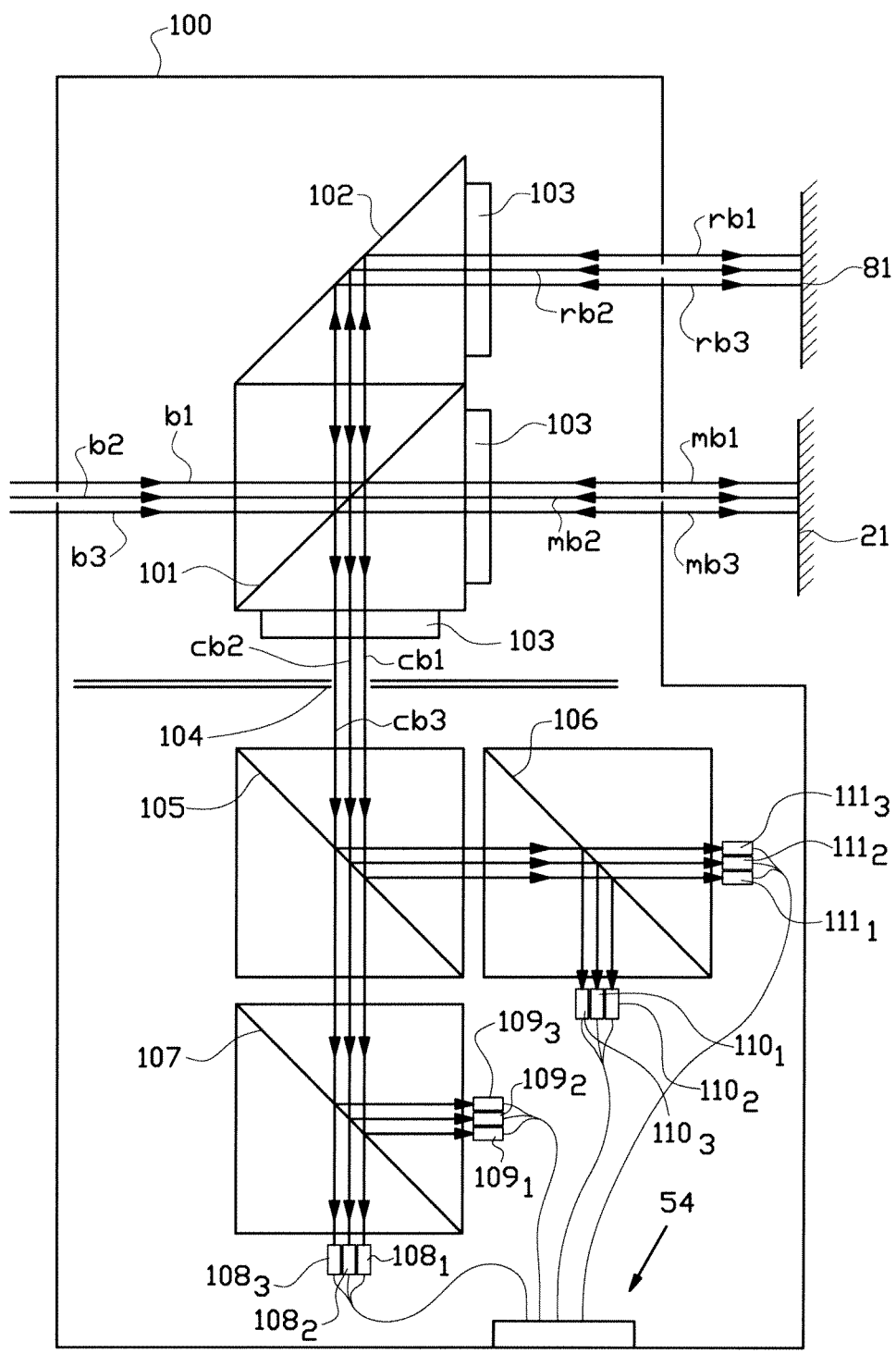
FIG. 4C shows a graph of signals obtained using a further embodiment of a differential interferometer according to the present invention.

FIG. 4C schematically shows an interferometer head according to the invention similar to the embodiment shown in FIG. 4A, however wherein three coherent light beams b1,b2,b3 are incident on polarizing beam splitter 101 instead of only one. This results in three reference beams rb1,rb2, rb3 being emitted towards the second mirror 81, and three measurement beams being emitted towards the first mirror 21. The three reference beams and associated three measurement beams are emitted from a beam source as described above, preferably non-coplanarly.

The three reflected reference beams and associated three reflected measurement beams are combined into three combined beams which pass the iris 104 and are split up in the same manner as described above. Beam receiving intensity detectors $108_1, 108_2, 108_3$ detect an interference of a portion of each of the combined beams cb1,cb2,cb3 respectively. Detectors $109_1, 109_2, 109_3$, $110_1, 110_2, 110_3$, $111_1, 111_2, 111_3$ function likewise for combined beam portions with different polarizations, resulting in a total of 12 detection signals. From these detection signals sinusoidal curves can be constructed which provide information on relative displacement and rotation of the two mirrors 81,21.

FIGS. 5A and 5B show a top view and a side view of a lithography system according to the present invention, in which a first and a second differential interferometer module 60A,60B as described herein are arranged for measuring a displacement of the wafer 7 relative to projection optics 5. The projection optics is provided with two planar mirrors 81A, 81B, arranged at a 90 degrees angle with respect to each other. The wafer 7 is supported by a wafer table 6 which comprises two planar mirrors 21A and 21B arranged at a 90 degrees angle with respect to each other as well. The first differential interferometer module 60A emits three reference beams rb1,rb2,rb3 on mirror 81A of the projection optics, and emits three measurement beams on mirror 21A of the wafer table. Similarly, the second differential interferometer module 60B emits reference beams on mirror 81B of the projection optics, and emits measurement beams on mirror 21B of the wafer table.

In summary the present invention relates to a lithography system comprising an optical column, a moveable target carrier for displacing a target such as a wafer, and a differential interferometer module, wherein the interferometer module is adapted for emitting three reference beams towards a second mirror and three measurement beams towards a first mirror for determining a displacement between said first and second mirror. In an embodiment the same module is adapted for measuring a relative rotation around two perpendicular axes as well. It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

IN THE FIGURES

LB laser beam
b coherent beam
cb combined beam
cb1,cb2,cb3 combined beams
b1,b2,b3 coherent beams
rb1,rb2,rb3 reference beams
rb reference beams
mb1,mb2,mb3 measurement beams
mb measurement beams
sig1,sig2,
sig3,sig4 intensity signals
1 lithography system
2 vacuum housing
3 electron optics
4 frame
5 projection optics
6 wafer table
7 wafer
8 kinematic mount
9 stage
10 plurality of exposure beamlets
11 stage
21,21A,21B first mirror
31 laser unit
32,34,42 beam splitter
33,35,43 prism
36 optical column
37 optical axis
51,52,53 light detectors
54,58 signal wires
55 electronics of interferometer
56 measurement of position second mirror with respect to first mirror
57 alignment sensor
59,61 vacuum feed-through
60, 60A, 60B interferometer head/interferometer module
62,63,64 kinematic mount
65 alignment marker
66 chuck
67 actuators of projection optics
71,72,73 holes for measurement beams
74,75,76 holes for reference beams
81, 81A,81B second mirror
91 vacuum feed-through
92 optical fiber
94 signal processing module
95 stage control
100 interferometer head
101 polarizing beam splitter
102 prism
103 quarter wave plate
104 iris
105 non polarizing beam splitter
106,107 polarizing beam splitter
108, $108_1$, $108_2$,$108_3$ detectors
109, $109_1$, $109_2$,$109_3$ detectors
110, $110_1$, $110_2$,$110_3$ detectors
111, $111_1$, $111_2$,$111_3$ detectors
121,122 sinusoidal curves

The invention claimed is:
1. Method for measuring a relative displacement between a first mirror and a second mirror in a lithography system, wherein said first mirror is connected to an exposure tool of said system and said second mirror is connected to a target to be exposed by said system, wherein said first mirror is moveable relative to said second mirror,
  wherein said method is performed using a differential interferometer module which comprises:
  a beam source (32,33,34) adapted for generating three coherent beams (b1,b2,b3), and for directing said three coherent beams to a unitary beam splitter;
  wherein said unitary beam splitter (42) is adapted for splitting said three coherent beams into three respective pairs of reflected measurement beams (mb1,mb2,mb3) and associated reflected reference beams (rb1,rb2,rb3);
  a unitary beam combiner (42) for combining said three reflected measurement beams with said associated three reflected reference beams to three corresponding combined beams (cb1,cb2,cb3); and
  three beam receivers (51,52,53), each for receiving said one of said three combined beams,
  wherein said method comprises the steps of
  a) generating three coherent beams, and directing said three coherent beams to the unitary beam splitter,
  b) splitting said three coherent beams up into three measurement beam and associated reference beam pairs, wherein said three coherent beams are split using the unitary beam splitter, wherein said generating is performed before said splitting,
  c) after said splitting in step b):
    directing said three measurement beams to be incident on said first mirror to be reflected thereby, wherein said three measurement beams are non-coplanar,
    directing said three reference beams to be incident on said second mirror to be reflected thereby, wherein said three reference beams are non-coplanar,
    wherein said three reference beams and said three measurement beams incident on said first and second minor respectively are all parallel to each other,
  d) combining said three reflected measurement beams with their three associated reflected reference beams to provide three combined beams, each combined beam being a combination of one reflected measurement beam and one reflected reference beam, wherein the unitary beam combiner is used for combining said three reflected measurement beams with their three associated reflected reference beams to provide three combined beams,
  e) projecting each one of said three combined beams onto a corresponding one beam receiver, each receiver adapted for converting a combined beam into a signal representative of a change in position and/or orientation of the first minor relative to the second minor.

2. Method according to claim 1, wherein a first incident measurement beam and a second incident measurement beam span a first plane and the second incident measurement beam and a third incident measurement beam span a second plane at an angle α to the first plane, and a first incident reference beam and a second incident reference beam span a third plane and the second incident reference beam and a third incident reference beam span a fourth plane at the same angle α to said third plane.

3. Method according to claim 2, wherein said angle α is 90°.

4. Method according to claim 3, wherein the second plane and the fourth plane coincide.

5. Method according to claim 1, wherein the three incident measurement beams are parallel to each other and/or the three incident reference beams are parallel to each other.

6. Method according to claim 1, wherein each of said three incident measurement beams is parallel to its associated incident reference beam,
wherein each of said measurement beams is reflected only once by said first mirror, and each of the reference beams is reflected only once by the second mirror.

7. Method according to claim 1, wherein said three coherent beams are generated from a single beam.

8. Method according to claim 1, comprising the step of converting an intensity of a combined beam to an electrical signal at said beam receivers.

9. Method according to claim 1, wherein a first reference beam and a second reference beam are emitted at a distance from each other which is equal to a distance between a first measurement beam and a second measurement beam,
wherein said first reference beam and a third reference beam are emitted at a distance from each other equal to a distance between said first measurement beam and a third measurement beam, and
wherein said second reference beam and a third reference beam are emitted at a distance from each other equal to a distance between said second measurement beam and said third measurement beam.

10. Method according to claim 1, wherein said measurement beams are emitted onto the first mirror at the level of said target.

11. Method according to claim 1, wherein a measurement beam and a reference beam of a pair of said measurement and associated reference beam pairs are emitted at a distance of 4 mm or less from each other.

12. Method according to claim 1, wherein said three coherent beams as generated by said beam source and directed to said unitary beam splitter, are non-coplanar.

13. Lithography system comprising a frame,
an optical column for projecting a pattern onto a target, said optical column mounted to said frame,
a target carrier for moving said target relative to the optical column,
wherein the target carrier is provided with a first mirror,
wherein the optical column is provided with a second mirror, and
one or more differential interferometer modules for generating one or more signals representative of a displacement of the target carrier relative to the optical column,
wherein each of said differential interferometer modules comprises a beam source adapted for providing three coherent beams, and for directing said three coherent beams to a beam splitter unit,
each of said one or more interferometer modules further comprising:
said beam splitter unit adapted for splitting said three coherent beams up in three respective measurement beam and associated reference beam pairs, wherein said three beams are generated before splitting said three beams into said respective beam pairs, wherein, after said splitting, the three measurement beams are directed to be incident on and reflected back by the first mirror and the three reference beams are directed to be incident on and reflected back by the second mirror, said beam splitter unit comprising a single beam splitter for splitting said three beams into said three measurement beam/reference beam pairs,
a unitary beam combiner for combining said three reflected measurement beams with their associated three reflected reference beams into three combined beams, each combined beam being a combination of one reflected measurement beam and one reflected reference beam, and
three beam receivers, configured for each receiving one of said three combined beams, wherein each of said three combined beams is projected onto a corresponding beam receiver.

14. Lithography system according to claim 13, wherein the differential interferometer module is arranged for emitting said three measurement beams non-coplanarly from said module to the first mirror, and further arranged for emitting said reference beams non-coplanarly from said module to the second mirror.

15. Lithography system according to claim 13, wherein a first incident measurement beam and a second incident measurement beam span a first plane and the second incident measurement beam and a third incident measurement beam span a second plane at an angle α to the first plane, and a first incident reference beam and a second incident reference beam span a third plane and the second incident reference beam and a third incident reference beam span a fourth plane at the same angle α to said third plane.

16. Lithography system according to claim 15, wherein said angle α is 90°.

17. Lithography system according to claim 16, wherein the second plane and the fourth plane coincide.

18. Lithography system according to claim 13, wherein the three incident measurement beams are parallel to each other and/or the three incident reference beams are parallel to each other.

19. Lithography system according to claim 13, wherein each of said three incident measurement beams is parallel to its associated incident reference beam,
wherein each of said measurement beams is reflected only once by said first mirror, and each of the reference beams is reflected only once by the second mirror.

20. Lithography system according to claim 13, wherein the beam source comprises an optical fiber.

21. Lithography system according to claim 13, wherein the beam source comprises a single beam emitter for providing a single beam.

22. Lithography system according to claim 13, wherein the beam receivers comprise beam intensity detectors adapted for converting an intensity of a combined beam to an electrical signal.

23. Lithography system according to claim 13, wherein the beam receivers comprise fiber ends of optical fibers leading out of the module.

24. Lithography system according to claim 13, wherein said target carrier is moveable in a first direction of movement and in a second direction of movement perpendicular to said first direction, wherein said at least one differential interferometer module is adapted for generating a signal representative of a displacement of the first mirror relative to said second mirror along said first direction, wherein said optical column has an optical axis,
wherein said at least one differential interferometer module is further adapted for providing a signal representative of a rotation between the first mirror and the second mirror around said an axis parallel to said optical axis, as well as for providing a signal representative of a rotation between the first mirror and the second mirror around an axis parallel to said second direction of movement.

25. Lithography system according to claim 13, wherein said module is adapted for emitting said reference beams and said measurement beams, a distance between a first reference beam and a second reference beam being equal to a distance between a first measurement beam and a second measurement beam,
  a distance between a first reference beam and a third reference beam being equal to a distance between a first measurement beam and a third measurement beam, and
  a distance between a second reference beam and a third reference beam being equal to a distance between a second measurement beam and a third measurement beam.

26. Lithography system according to claim 13, wherein the first mirror is arranged on the target carrier to reflect the incident measurement beams at the level of said target.

27. Lithography system according to claim 13, wherein the beam splitter unit is arranged for providing at least one incident reference beam and at least one incident measurement beam at a distance of 4 mm or less from each other.

28. Lithography system according to claim 13, said system comprising a vacuum chamber, wherein said one or more interferometer modules is mounted to the frame within said vacuum chamber.

29. Lithography system according to claim 13, wherein said one or more interferometer module is mounted to said frame by means of a kinematic mount.

30. Lithography system according to claim 13, wherein said beam source is arranged for providing said three coherent beams non-coplanarly.

31. Differential interferometer module comprising:
  a beam source adapted for providing three coherent beams, and for directing said three coherent beams to a beam splitter unit,
  wherein the beam splitter unit is adapted for splitting said three coherent beams into respective pairs of measurement beams and associated reference beams, wherein said three beams are generated before splitting said three beams into said respective beam pairs, wherein, after said splitting, the three measurement beams are directed to be incident on a first mirror and the three reference beams are directed to be incident on a second mirror moveable with respect to said first mirror, and wherein said beam splitter unit comprises a single beam splitter for splitting said three beams into said three measurement beam/reference beam pairs,
  a unitary beam combiner for combining each reflected measurement beam with its associated reflected reference beam to a combined beam, thereby forming three combined beams, each combined beam being a combination of one reflected measurement beam and one reflected reference beam, and
  three beam receivers, wherein each combined beam is projected onto a corresponding one of said three beam receivers.

32. Differential interferometer module according to claim 31, wherein said three beam receivers each comprise an intensity detector for detecting an intensity of a corresponding combined beam.

33. Differential interferometer module according to claim 31, wherein the beam splitter unit is adapted for emitting said three measurement beams non-coplanarly, and/or for emitting said three reference beams non-coplanarly.

34. Differential interferometer module according to claim 33, wherein a first incident measurement beam and a second incident measurement beam span a first plane and the second incident measurement beam and a third incident measurement beam span a second plane at an angle α to the first plane, and a first incident reference beam and a second incident reference beam span a third plane and the second incident reference beam and a third incident reference beam span a fourth plane at the same angle α to said third plane.

35. Differential interferometer module according to claim 34, wherein said angle α is 90°.

36. Differential interferometer module according to claim 34, wherein the second plane and the fourth plane coincide.

37. Differential interferometer module according to claim 31, wherein the three incident measurement beams are parallel to each other and/or wherein the three incident reference beams are parallel to each other.

38. Differential interferometer module according to claim 31, wherein each of said three incident measurement beams is parallel to its associated incident reference beam,
  wherein each of said measurement beams is reflected only once by said first mirror, and each of the reference beams is reflected only once by the second mirror.

39. Differential interferometer module according to claim 31, wherein said first and second mirror are spaced apart from said module.

40. Differential interferometer module according to claim 31, wherein the inside of said module is filled with a solid material.

41. Differential interferometer module according to claim 31, wherein the beam splitter and the beam combiner are comprised in a single integrated unit.

42. Differential interferometer module according to claim 31, wherein said beam source is arranged for providing said three coherent beams non-coplanarly.

* * * * *

UNITED STATES PATENT AND TRADEMARK OFFICE
CERTIFICATE OF CORRECTION

PATENT NO. : 9,678,443 B2  
APPLICATION NO. : 13/436736  
DATED : June 13, 2017  
INVENTOR(S) : Guido de Boer et al.

Page 1 of 1

It is certified that error appears in the above-identified patent and that said Letters Patent is hereby corrected as shown below:

In the Claims

Column 14, Claim 1, Line 59, please delete "first minor" and insert --first mirror--, and delete "second minor" and insert --second mirror--.

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*